United States Patent [19]

Sinkunas et al.

[11] Patent Number: 5,715,140
[45] Date of Patent: Feb. 3, 1998

[54] OVERLAY SUBSTRATE FOR SECURING ELECTRONIC DEVICES IN A VEHICLE

[75] Inventors: Peter Joseph Sinkunas, Canton; Andrew Zachary Glovatsky, Ypsilanti; Michael George Todd, South Lyon; Myron Lemecha, Dearborn, all of Mich.

[73] Assignee: Ford Motor Company, Dearborn, Mich.

[21] Appl. No.: 642,287

[22] Filed: May 3, 1996

[51] Int. Cl.$^6$ .................................................. H05K 7/20
[52] U.S. Cl. .................... 361/690; 396/208; 307/10.1; 361/627; 361/749
[58] Field of Search .................... 165/80.3, 122, 165/126; 62/244, 259.2; 296/146.1, 154, 192, 208; 29/854, 857; 361/600, 601, 627, 689, 690, 691, 694–697, 717–720, 749, 807, 809, 810, 826, 827; 454/124, 127, 152; 307/9.1, 10.1, 147; 174/70 C, 72 A, 254

[56] References Cited

U.S. PATENT DOCUMENTS

| | | | |
|---|---|---|---|
| 4,520,425 | 5/1985 | Ito | 361/384 |
| 4,532,893 | 8/1985 | Day | 123/41.31 |
| 4,591,202 | 5/1986 | Burk et al. | 296/194 |
| 4,750,265 | 6/1988 | Watanabe et al. | 29/854 |
| 4,824,164 | 4/1989 | Nakayama et al. | 296/146 |
| 4,942,499 | 7/1990 | Shibata et al. | 361/428 |
| 4,969,066 | 11/1990 | Eibl | 361/413 |
| 4,974,121 | 11/1990 | Masuko | 361/749 |
| 5,132,874 | 7/1992 | Chandler | 361/386 |
| 5,255,155 | 10/1993 | Sugimoto | 361/749 |
| 5,276,584 | 1/1994 | Collins | 361/690 |
| 5,353,190 | 10/1994 | Nakayama et al. | 361/647 |
| 5,354,114 | 10/1994 | Kelman et al. | 296/192 |
| 5,442,518 | 8/1995 | Beam | 361/690 |
| 5,559,673 | 9/1996 | Gagnon | 361/695 |

*Primary Examiner*—Gerald P. Tolin
*Attorney, Agent, or Firm*—Leslie C. Hodges; Roger L. May

[57] ABSTRACT

An apparatus is provided for securing electronic devices in a vehicle. A ventilation duct is provided beneath the instrument panel for conveying air in the vehicle. The ventilation duct includes an outer surface. An overlay substrate is laid upon and secured against the outer surface or acts as the wall of the duct, and is adapted for carrying electronic devices thereon. This design improves packaging efficiency within the vehicle. This invention can also be applied to other automotive applications such as on door panels, instrument panels and package trays.

9 Claims, 2 Drawing Sheets

OVERLAY SUBSTRATE FOR SECURING ELECTRONIC DEVICES IN A VEHICLE

TECHNICAL FIELD

The present invention relates to an apparatus for securing electronic devices in a vehicle and, more particularly, to a substrate adapted to be laid upon a ventilation duct or other plastic support structure such as a door panel, instrument panel or package tray to carry electronic devices.

BACKGROUND OF THE INVENTION

Typically, electronic devices stored beneath a vehicle instrument panel are mounted on a thin substrate (circuit card) enclosed within a metal box or housing having bundles of wires (wiring harness) running into and out of the metal box. The metal box must be mounted to a support structure beneath the instrument panel and supported in an appropriate position, preferably behind the center stack bezel of the instrument panel for providing electronic support to the vehicle temperature control and sound systems, as well as other electronic instrument panel components, such as the anti-lock brake module, EEC engine control module, air bag module, etc.

This assembly can consume a substantial amount of space beneath the instrument panel. The bulky metal box with bundles of wires extending therefrom will have substantial space requirements, and will adversely affect packaging design efficiency in the vehicle. Furthermore, the metal box adds to manufacturing costs and vehicle weight.

It is desirable to provide an apparatus for storing such electronic devices beneath the instrument panel assembly in a manner in which packaging efficiency is improved and manufacturing costs and weight are reduced.

DISCLOSURE OF THE INVENTION

The present invention overcomes the above-referenced shortcomings of prior art assemblies by providing an overlay substrate adapted for supporting electronic devices thereon, and further adapted to be overlaid upon and attached to a ventilation duct or other plastic support structure. The substrate may be bent either before or after application of electronic devices thereto, and is laid against the outer surface of the duct in a manner to improve packaging efficiency beneath the vehicle instrument panel.

More specifically, the present invention provides an apparatus for securing electronic devices in a vehicle, comprising a ventilation duct for conveying air in the vehicle. The ventilation duct includes an outer surface. An overlay substrate is laid upon and secured against the outer surface. The overlay substrate is bendable for matching the contour of the outer surface, and is adapted for carrying electronic devices thereon.

In a preferred embodiment, the duct includes an aperture formed therein, and the substrate includes a metal heat sink device secured thereto for cooperation with the aperture for dissipating heat from the electronic devices into the duct.

Accordingly, an object of the present invention is to provide an apparatus for securing electronic devices on a vehicle duct in a manner in which packaging efficiency is improved in the vehicle.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1:
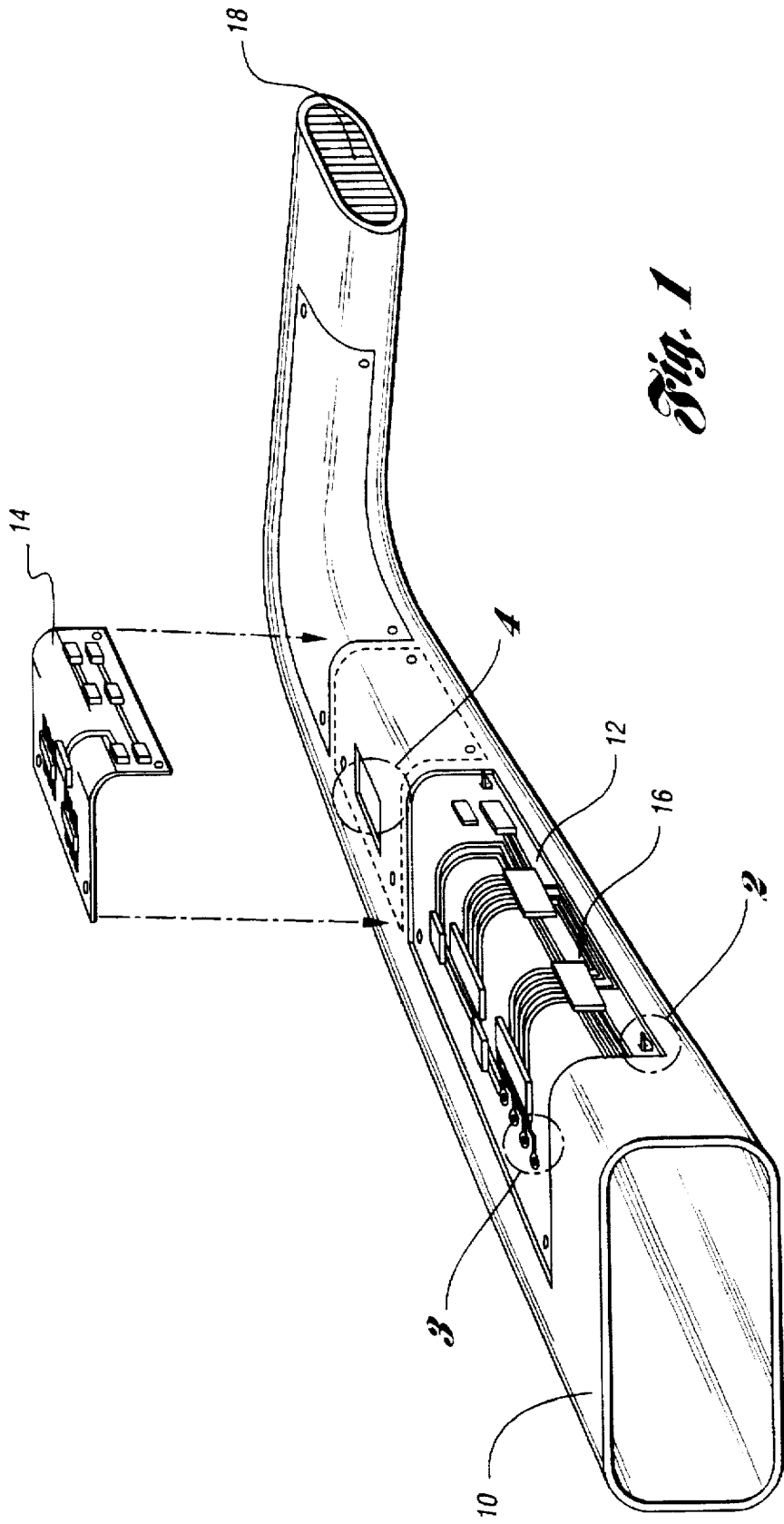
FIG. 1 shows a partially cut-away exploded perspective view of a ventilation duct having a plurality of overlay substrates secured thereon in accordance with the present invention.

FIG. 1 shows a partially cut-away exploded perspective view of a ventilation duct 10 supporting overlay substrates 12,14. The overlay substrates 12,14 include electronic devices 16 secured thereon.

This design is more cost effective and manufacturing efficient than the prior art method of storing electronic devices within a metal box secured beneath the instrument panel assembly. It is also more efficient than securing the electronic devices directly to the duct. This invention decouples the manufacturing, material, and component cost from the main duct or instrument panel structure to the overlay substrate. The overlay substrate contains the majority of the electronic features and value added assembly cost. This feature is important because of process fallout and scrap cost issues which could arise if the electronics were intimately bonded to the main duct. By physically decoupling the electronics from the main duct and onto an overlay substrate which is easier to handle, assemble and service, the scrap and fallout issues are transferred to the substrate. The overlay substrates 12,14 can then be physically attached to the duct 10 in such a manner as to be easily removed but to take advantage of the base duct or mechanical support, electrical interconnection and thermal management. The ventilation duct 10 further includes a register 18 at a distal end thereof for communication with the vehicle passenger compartment.

The overlay substrates 12,14 may be constructed of various desired materials in order to control material properties such as CTE (coefficient of thermal expansion), HDT (heat deflection temperature) and other properties, while reducing costs. By controlling the substrate properties, the reliability of the assembly can be improved.

In addition, more traditional circuit board materials such as FR-4 (Fire Retardant-4—epoxy plastic thermoset) can be used as the substrate material. The forming of the substrate materials to match the contour of the duct 10 can be accomplished by mechanical bending or by thermal forming. If traditional circuit board materials are used, they can be rigid or bendable. For example, thin FR-4 can be bent and fastened to the base duct work. The thin FR-4, while planar, can be populated with electronic devices and strategically bent during or prior to attachment on the duct work or other structure. Other substrate materials which are thermoformable, such as TPO (thermoplastic polyolefin blends) can be populated when planar and then formed to the duct work or structure. Other desirable materials to be used could be ABS, polypropylene, polystyrene, PPO (polyphenylene oxide), nylon 6, nylon 6.6, polyethylene terephthalate (PET), and sometimes fillers, such as glass fiber, talc, or glass spheres can be used.

The circuitry layout will be provided so as to position devices preferably away from bend areas allowing only circuit traces to be formed in such areas. The stress and physical curvature of the formed substrate bend areas precludes the positioning of electronic components in these areas. Only highly ductile copper traces are to be used, as they can be drawn and bent to conform with the underlying surfaces.

Figure 2:
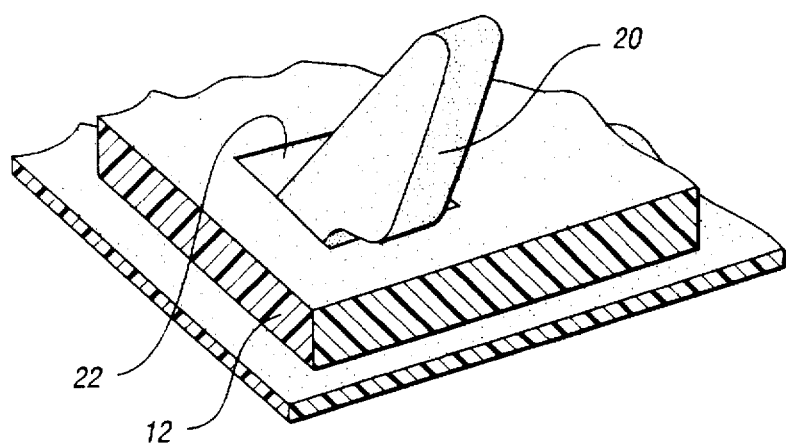
FIG. 2 shows a partially cut-away perspective view of an overlay substrate secured by an attachment tab to a ventilation duct in accordance with the present invention, as shown in FIG. 1.

The interconnection of the overlay substrates 12,14 with the ventilation duct 10 is achieved by mechanical fasteners. The fastening can be accomplished by snap-fit features which would be molded into the substrates 12,14 and duct 10, as shown in FIG. 2. FIG. 2 shows an attachment tab 20 which extends from the ventilation duct 10 for receipt in an attachment aperture 22 formed in the overlay substrate 12 for attaching the substrate 12 to the duct 10. Alternatively, more traditional fasteners such as screws could be used.

Figure 3:
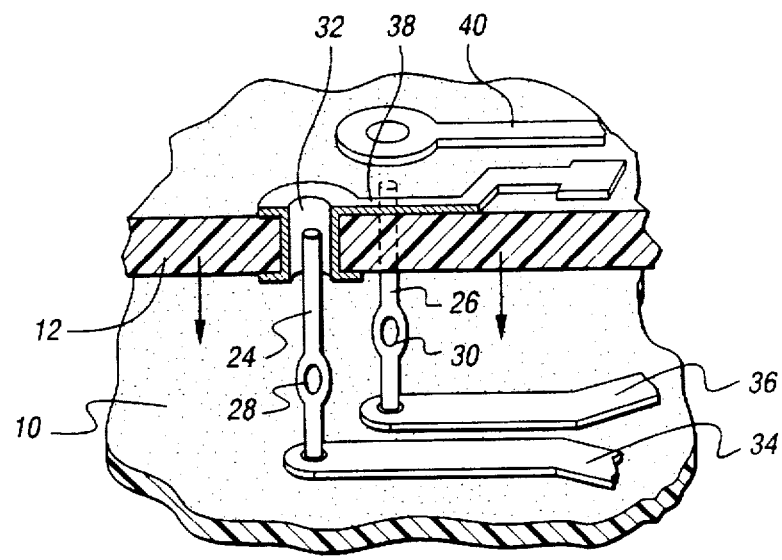
FIG. 3 shows a partially cut-away, perspective exploded view of surface circuitry secured to an overlay substrate and including press-fit pins extending through the overlay substrate for electrical communication with wires positioned on the substrate and the ventilation duct.

Referring to FIG. 3, electrical interconnections between the overlay substrates 12,14 and the duct 10 can be achieved through press-fit pins 24,26 mounted in the duct. The press-fit pins 24,26 include compressible eyelets 28,30, respectively, which are compressible within substrate apertures 32. The mechanical force provided by the eyelets 28,30 not only provides sturdy electrical connections between the wires 34,36 and the surface circuitry 38,40, respectively, but also supplies mechanical force to assist in securing the substrate 12 to the duct 10. Other electrical interconnects, such as wire bonding, flex circuits, edge connectors and soldering could also be used.

The separate substrates 12,14 also increase manufacturing and assembly flexibility. The overlay substrates 12,14 can be processed and populated in parallel with the instrument panel build. The substrates can be treated as modules which then plug into the main duct 10. The size and shape of each overlay substrate can be designed to provide the most efficient method of packaging the electronics.

Figure 4:
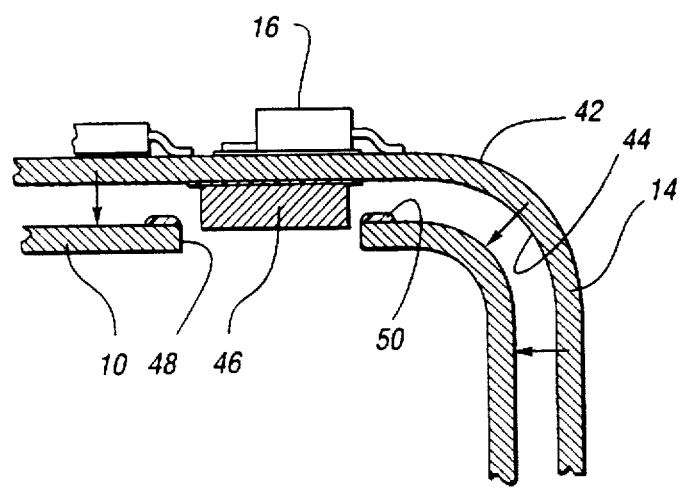
FIG. 4 shows a partially cut-away, exploded vertical cross-sectional view of an overlay substrate secured to a ventilation duct, and including a metal heat sink in accordance with the present invention.

As shown in FIG. 4, the overlay substrate 14 may also take advantage of the underlying duct 10 for heat sinking. As shown in FIG. 4, the substrate 14 includes electronic devices 16 mounted on a first surface 42, and a metal heat sink 46 mounted on a second surface 44 of the overlay substrate 14. The metal heat sink 46 is provided in thermal communication with the electronic devices 16. A corresponding passage or aperture 48 is formed through the duct 10 for cooperation with the metal heat sink 46. Thermal adhesive 50 is provided between the substrate 14 and duct 10 for securing the substrate 14 to the duct 10. The adhesive ensures intimate thermal contact between the substrate and the metal heat sink and also seals any duct openings. As air travels through the duct 10, it carries heat away from the metal heat sink 46, thus convectively cooling the electronic devices 16.

Thermal management can also be accomplished through forming the overlay substrate over a metal plate which can be molded in the duct or bonded to the base duct. This overlay substrate can either be secured on the duct outer surface, or it may cover a similarly sized hole formed in the duct. If the substrate were to be placed over a hole formed in the duct, it would preferably be a FR-4 (thermoset) material, or a metal plate with FR-4 bonded to it.

The substrate 12,14 could comprise thicknesses varying from approximately 0.002 inches to approximately 0.200 inches, depending upon the structural integrity required for the specific application.

The duct could be designed of low cost materials, such as polyethylene, rather than ABS or SMA, and the duct could be formed by blow molding rather than injection molding. In addition, the duct can be formed with varying degrees of rigidity, i.e. different areas of increased or decreased polymer thickness, in order to provide areas to support the mechanical interlocking features and electrical interconnects.

While the best modes for carrying out the invention have been described in detail, those familiar with the art to which this invention relates will recognize various alternative designs and embodiments for practicing the invention within the scope of the appended claims.

What is claimed is:

1. An apparatus securing electronic devices in a vehicle, the vehicle including a plastic ventilation duct conveying air in the vehicle, the apparatus comprising:

an overlay substrate supporting active electronic devices thereon, and said overlay substrate being overlaid upon and attached to the plastic ventilation duct, wherein the ventilation duct includes a passage such that the conveyed air within the ventilation duct dissipates heat away from the active electronic device through the passage.

2. The apparatus of claim 1, wherein the ventilation duct comprises a contoured surface and said substrate is bendable to facilitate matching the contour of the duct.

3. The apparatus of claim 1, wherein the ventilation duct comprises a contoured surface and said substrate comprises a rigid material.

4. The apparatus of claim 1, wherein the ventilation duct comprises a contoured surface and said substrate comprises a formable thermoplastic material.

5. The apparatus of claim 1, wherein the substrate comprises first and second sides, the first side adapted for receiving electronic devices, and the second side comprising a metal heat sink device secured thereto for dissipating heat from the electronic devices into the duct.

6. An apparatus securing electronic devices in a vehicle, comprising:

a ventilation duct conveying air in the vehicle and having an outer surface; and an overlay substrate laid upon and secured against said outer surface, and carrying active electronic devices thereon, wherein the ventilation duct includes a passage such that the conveyed air dissipates heat away from the active electronic devices through the passage.

7. The apparatus of claim 6, wherein said passage comprises an aperture formed therein and said substrate comprises a metal heat sink device secured thereto and extending through said aperture for dissipating heat from the electronic devices into the duct.

8. The apparatus of claim 6, wherein said substrate comprises a plurality of attachment holes formed therein, and said duct comprises a plurality of attachment tabs extending therefrom for engagement with said attachment holes to secure the substrate to the duct.

9. An apparatus securing electronic devices in a vehicle, comprising:

a ventilation duct conveying air in the vehicle and having an outer surface, said duct further comprising an aperture formed therein, and having a plurality of attachment tabs extending therefrom;

a bendable overlay substrate laid upon and secured against said outer surface, and carrying active electronic devices thereon, said substrate further comprising a plurality of attachment holes formed therethrough and receiving said attachment tabs, and having a metal heat sink device extending through said aperture for dissipating heat from the electronic devices into the conveyed air in the duct.

* * * * *